(12) United States Patent
Sivadasan et al.

(10) Patent No.: US 7,424,650 B1
(45) Date of Patent: Sep. 9, 2008

(54) CIRCUIT TO MEASURE SKEW

(75) Inventors: Mohandas Palathol Mana Sivadasan, Bangalore (IN); Gajender Rohilla, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 496 days.

(21) Appl. No.: 11/152,980

(22) Filed: Jun. 14, 2005

Related U.S. Application Data

(60) Provisional application No. 60/592,059, filed on Jul. 28, 2004.

(51) Int. Cl.
*G01R 31/28* (2006.01)
(52) U.S. Cl. ...................................................... 714/700
(58) Field of Classification Search .................. None
See application file for complete search history.

(56) References Cited

U.S. PATENT DOCUMENTS

| | | | | |
|---|---|---|---|---|
| 5,047,710 A | * | 9/1991 | Mahoney | ..................... 324/537 |
| 5,463,655 A | * | 10/1995 | Llewellyn | ..................... 375/359 |
| 5,579,352 A | * | 11/1996 | Llewellyn | ..................... 375/376 |
| 5,740,210 A | * | 4/1998 | Rokugawa | ..................... 375/362 |
| 6,850,051 B2 | * | 2/2005 | Roberts et al. | ........... 324/76.54 |
| 6,946,640 B1 | * | 9/2005 | Kawamura | ............... 250/214 R |

* cited by examiner

*Primary Examiner*—Cynthia Britt
*Assistant Examiner*—Steven D Radosevich
(74) *Attorney, Agent, or Firm*—Blakely, Sokoloff, Taylor & Zafman LLP

(57) ABSTRACT

A method and test circuits for measuring skew between two circuit blocks of an integrated circuit. A first data signal is propagated through a first circuit block and a first clock signal is propagated through a second circuit block. The first data signal is latched synchronized to the first clock signal after propagating the first data and clock signals. The first data signal is time shifted relative to the first clock signal until the first data signal is no longer validly latching. A second data signal is propagated through the second circuit block and a second clock signal is propagated through the first circuit block. An inversion of the second data signal synchronized to an inversion of the second clock signal is latched. Then, the second data signal is time shifted relative to the second clock signal until the inversion of the second data signal is no longer validly latching.

20 Claims, 6 Drawing Sheets

CIRCUIT TO MEASURE SKEW

CROSS-REFERENCE TO RELATED APPLICATION

This application claims the benefit of U.S. Provisional Application No. 60/592,059, filed on Jul. 28, 2004, the contents of which are incorporated herein by reference.

TECHNICAL FIELD

This disclosure relates generally to integrated circuits, and in particular but not exclusively, relates to measuring skew between two signals propagating within an integrated circuit.

BACKGROUND INFORMATION

A concern in the design of modern high-speed integrated circuits ("ICs") is the delay differential between data and associated clock signals as they propagate through the IC. This propagation delay differential is referred to as "skew." Skew related issues are particularly acute at high-clock speeds. Timing skew arises when the data arrives at a particular point in the IC delayed or early relative to the time its associated clock signal arrives at the same point. If timing skew is sufficiently large, then invalid data may be sampled or latched causing an error. Skew is a major constraint in the timing margins of the high speed ICs.

FIG. 1 illustrates a conventional test circuit 100 for measuring skew between a data buffer 105 and a clock buffer 110. The propagation delay of data signal 115 through data buffer 105 is Td while the propagation delay of clock signal 120 through clock buffer 110 is Tc+Tskew, where Tskew represents the skew or propagation delay differential between data buffer 105 and clock buffer 110. To measure Tskew at the outputs of data buffer 105 and clock buffer 110, application of data signal 115 is delayed (also referred to as "schmoo'd") relative to application of clock signal 120, until flip flop 125 fails to validly recognize data signal 115 and therefore invalid data is latched through to output 130. At the point of failure, the applied delay Tapp between clock signal 120 and data signal 115 is measured and Tskew is calculated using the following equations:

$$Tapp-Te=Tskew+Tsetup,$$

where Te represents the expected delay if zero skew is present and Tsetup represents the setup time of flip flop 125. Assuming Tskew is much greater than Tsetup, that is if the setup time of flip flop 125 is negligible compared to Tskew, then Tskew approximately equals Tapp-Te. A disadvantage of the above conventional approach is that it is increasingly inaccurate if Tskew and Tsetup are of the same order of magnitude. In high-speed ICs, such as 1 Gbps serial links, Tsetup may approach Tskew, and therefore the conventional technique is inaccurate.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a circuit and technique for measuring timing skew in an integrated circuit are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. "Skew" is defined herein as the propagation delay differential between two signals. In the case of a data signal having a propagation delay Td1 and a clock signal having a propagating delay Td2, skew equals Td1-Td2.

Figure 1:
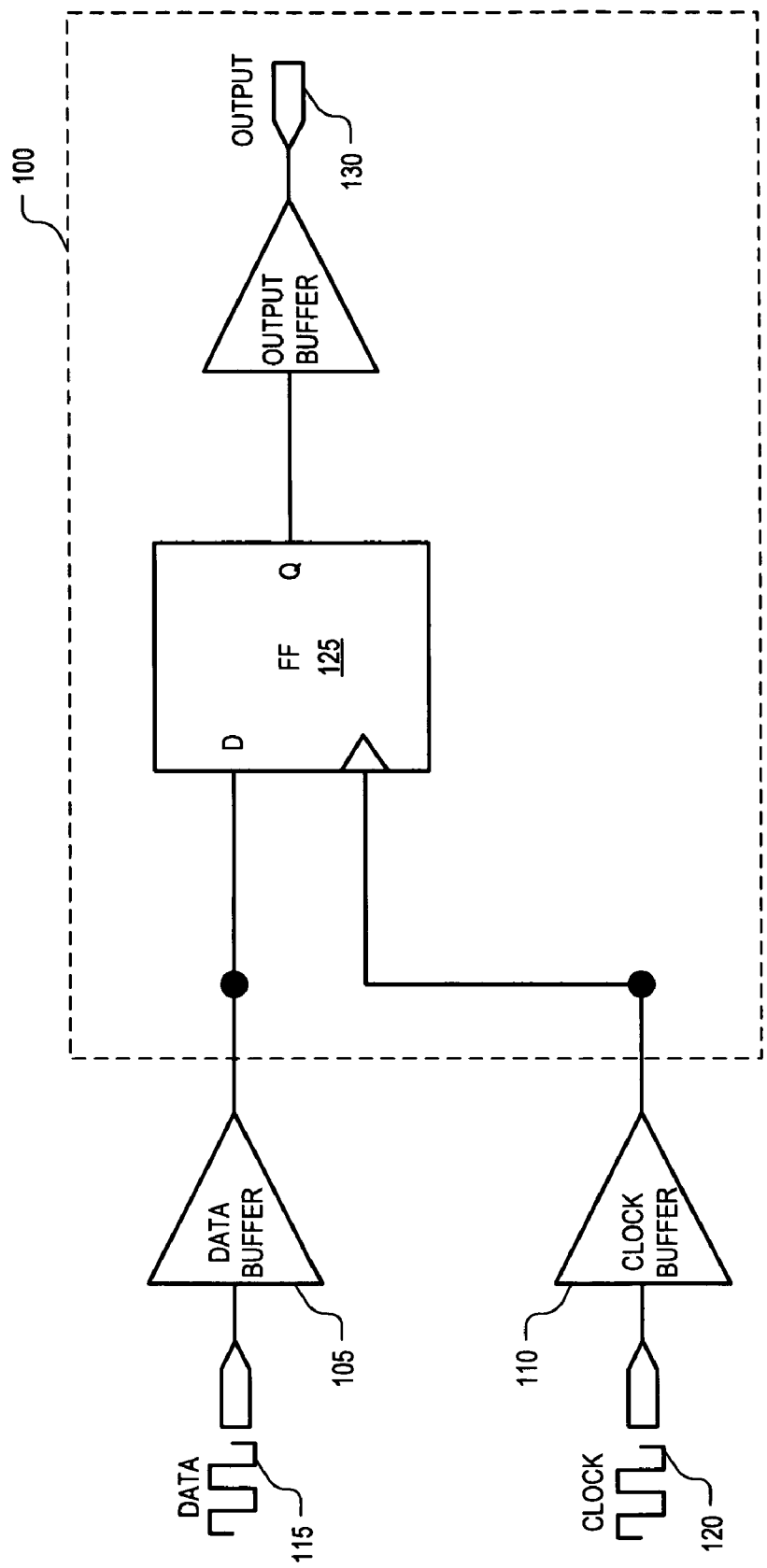
FIG. 1 is a schematic illustrating a conventional circuit for measuring skew between a data buffer and a clock buffer.
Figure 2:
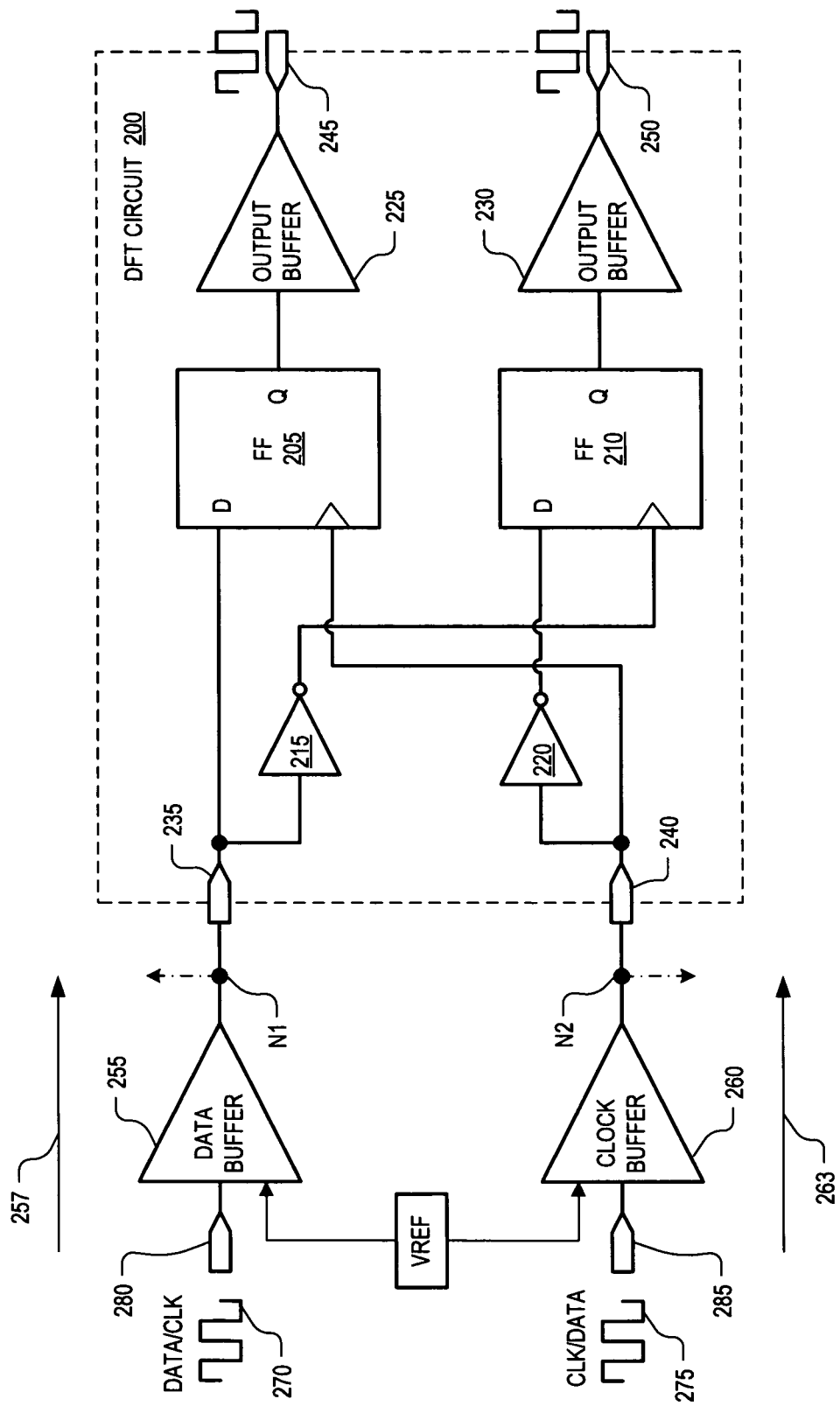
FIG. 2 is a schematic illustrating a design for test ("DFT") circuit for measuring skew between two points in a circuit, in accordance with an embodiment of the invention.

FIG. 2 is a schematic illustrating a design for test ("DFT") circuit 200 for measuring skew between any two nodes of an integrated circuit ("IC"), in accordance with an embodiment of the invention. The illustrated embodiment of DFT circuit 200 includes flip-flops ("FFs") 205 and 210, inverters 215 and 220, output buffers 225 and 230, inputs 235 and 240, and outputs 245 and 250. In one embodiment, FFs 205 and 210 are D flip-flops, though other types of flip-flops may be used, including rising edge and falling edge flip-flops, J-K flip-flops, T flip-flops, R-S latches, and other synchronous registering devices.

The components of DFT circuit 200 are interconnected as follows. Input 235 couples a node N1 to the data input D of FF 205 and to the clock input of FF 210 via inverter 215. Input 240 couples a node N2 to the clock input of FF 205 and to the data input D of FF 210 through inverter 220. The data output Q of FF 205 is coupled to output buffer 225, which in turn is coupled to output 245. The data output Q of FF 210 is coupled to output buffer 230, which in turn is coupled to output 250.

DFT circuit 200 may be embedded or integrated into an IC to measure skew generated between any two circuit blocks, such as a data buffer 255 and a clock buffer 260, or any two propagation paths through an IC, such as propagation paths 257 and 263. DFT circuit 200 is capable of measuring the skew that arises between a data signal 270 and a clock signal 275 at node N1 and N2 after data signal 270 and clock signal 275 propagate through data buffer 255 and clock buffer 260. Accordingly, DFT circuit 200 may be used to determine the skew induced between the circuit elements of data buffer 255 and clock buffer 260. The induced skew is a result of the propagation delay differential ΔTd between a propagation delay Td1 of propagation path 257 and a propagation delay Td2 of a propagation path 263. In the illustrated embodiment, propagation path 257 includes the propagation path of data signal 270 as it propagates from input 280 to node N1. Propagation path 263 includes the propagation path of clock signal 275 as it propagates from input 285 to node N2. Accordingly, equation 1 illustrates the relation between skew and the propagation delays Td1 and Td2.

$$skew = \Delta Td = Td1 - Td2 \quad \text{(Equation 1)}$$

It should be appreciated that DFT circuit 200 may be embedded within an IC at any point to determine skew between any two propagation paths. Embodiments of DFT circuit 200 are not limited to just testing the skew between a data buffer and a clock buffer, but rather may include longer propagation paths which each include an entire circuit block having multiple subcomponents and interconnects. As illustrated by the dashed lines extending from nodes N1 and N2, the outputs of data buffer 255 and clock buffer 260 may couple to other circuit elements within the IC. As such, DFT circuit 200 may be embedded within a larger IC and "tap" into the IC at any point to measure skew between any propagation path (e.g., propagation paths 257 and 263).

In one embodiment, DFT 200 may be coupled into an IC to determine the skew between nodes N1 and N2 of a data path and a clock path, respectively. In this embodiment, data buffer 255 may be a data buffer residing along the data path and clock buffer 260 may be a clock buffer residing along the clock path (e.g., clock tree or the like). In one embodiment, data buffer 255 and clock buffer 260 are differential logic, such as high-speed transceiver logic ("HSTL"). The logic state of differential logic is determined based on its voltage polarity with respect to a reference voltage Vref. Accordingly, FIG. 2 illustrates a reference voltage input into data buffer 255 and clock buffer 260 the differential logic embodiment.

Figure 3A:
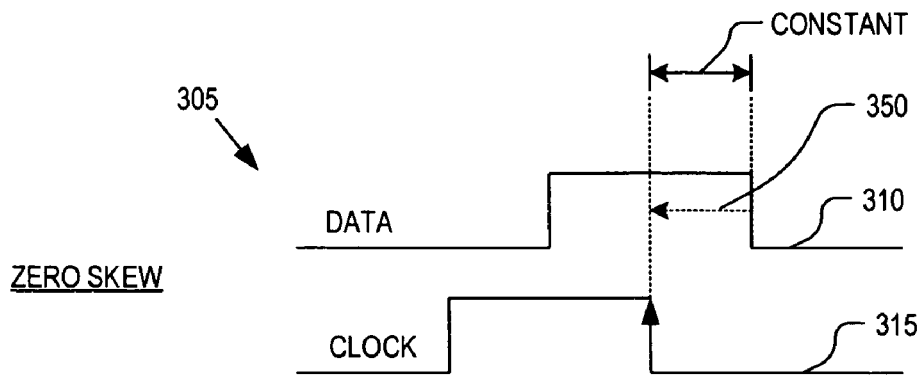
FIG. 3A is a timing diagram illustrating data and clock signal propagation having zero skew, in accordance with an embodiment of the invention.

FIG. 3A is a timing diagram 305 illustrating signal propagation having zero skew between a data signal 310 and a clock signal 315. In the illustrated embodiment, data signal 310 and clock signal 315 are latched into positive edge trigger flip-flops and therefore, clock signal 315 is phase delayed relative to data signal 310 by half a clock cycle. Clock signal 315 is phase delayed by half a clock cycle to ensure data signal 310 is valid by the time clock signal 315 reaches the target flip-flop to trigger latching of the data input through to the data output of the flip-flop. Since timing diagram 305 illustrates the situation of zero skew, data signal 310 and clock signal 315 maintain constant relative phase positions as they propagate along their respective propagation paths.

Figure 3B:
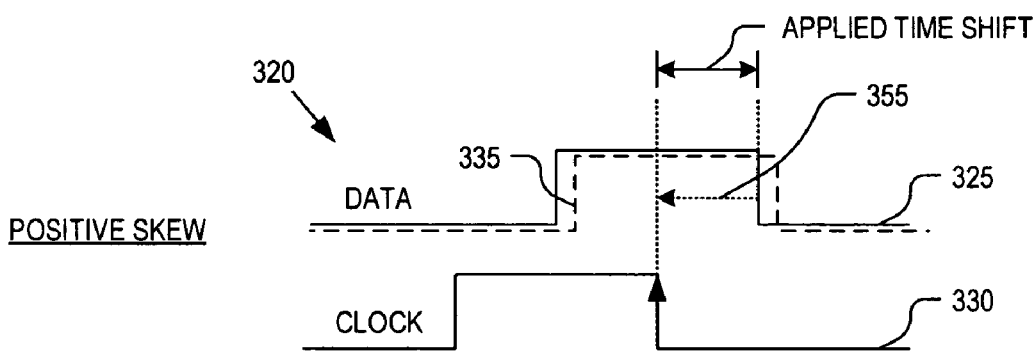
FIG. 3B is a timing diagram illustrating data and clock signal propagation having positive skew, in accordance with an embodiment of the invention.

FIG. 3B is a timing diagram 320 illustrating positive skew after a clock signal 330 and a data signal 325 traverse respective propagation paths. A dashed line 335 represents the relative position of data signal 325 to clock signal 330 if zero skew were present. However, since positive skew is present, data signal 325 arrives at the target flip-flop behind the zero skew situation illustrated by dashed line 335. In other words, FIG. 3B illustrates the situation where the data propagation path is slightly slower or the propagation delay larger than that of the clock propagation path. Accordingly, when defining the skew between a data signal and a clock signal, skew is defined according to equation 2.

$$skew = Td(\text{data}) - Td(\text{clock}) \quad \text{(Equation 2)}$$

where Td(data) represents the propagation delay of data signal 325 and Td(clock) represents the propagation delay of clock signal 330.

Figure 3C:
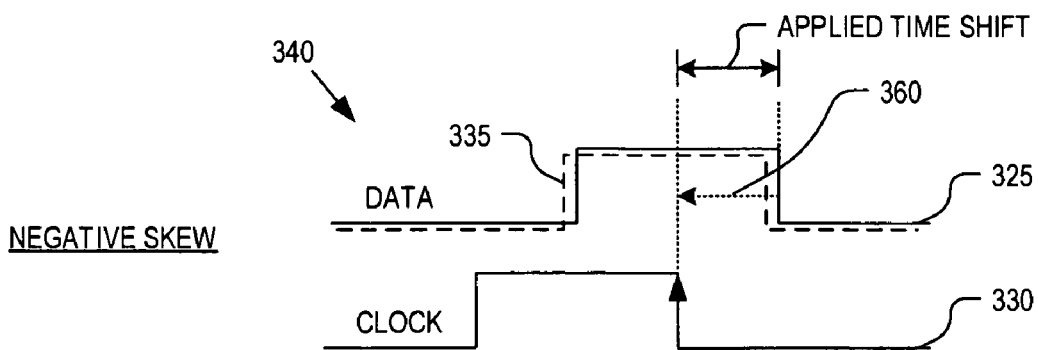
FIG. 3C is a timing diagram illustrating data and clock signal propagation having negative skew, in accordance with an embodiment of the invention.

FIG. 3C is a timing diagram 340 illustrating negative skew after a clock signal 330 and a data signal 325 traverse respective propagation paths. Again, dashed line 335 represents the relative position of data signal 325 to clock signal 330 if zero skew were present. However, since negative skew is present, data signal 325 arrives at a target flip-flop ahead of the zero skew situation illustrated by dashed line 335. In other words, FIG. 3C illustrates the situation where the data propagation path is slightly faster or the propagation delay smaller than that of the clock propagation path.

Figure 4:
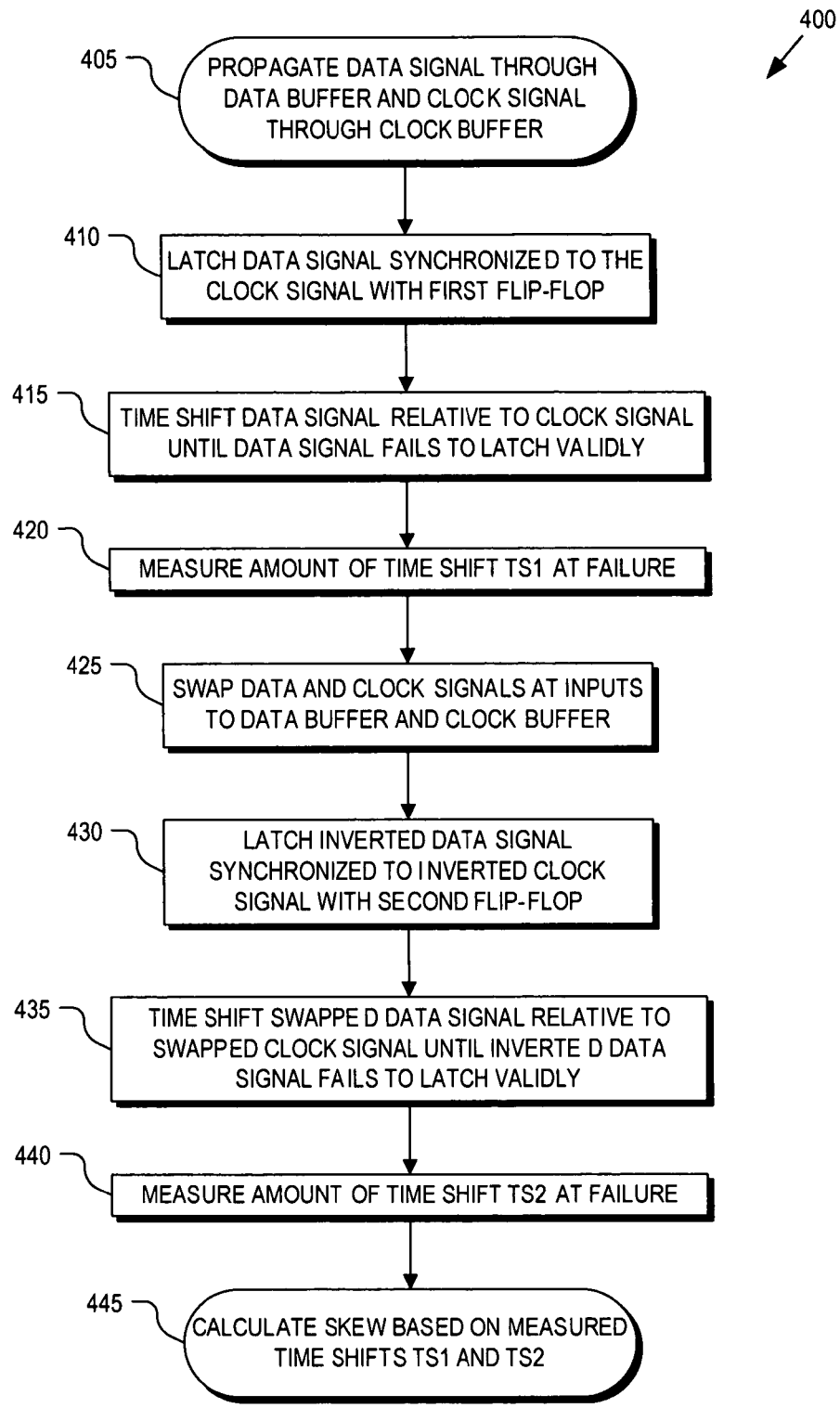
FIG. 4 is a flow chart illustrating a process for operating a DFT circuit for measuring skew between two points in a circuit, in accordance with an embodiment of the invention.

FIG. 4 is a flow chart 400 illustrating a process 400 for operating DFT circuit 200 for measuring skew between propagation paths 257 and 263 at nodes N1 and N2, in accordance with an embodiment of the invention. The order in which some or all of the process blocks appear in each process should not be deemed limiting. Rather, one of ordinary skill in the art having the benefit of the present disclosure will understand that some of the process blocks may be executed in a variety of orders not illustrated.

In a process block 405, data signal 270 is propagated from input 280, though data buffer 255 to node N1 and clock signal 275 is propagated from input 285 through clock buffer 260 to node N2. In a process block 410, data signal 280 is received at data input D of FF 205 and clock signal 275 is received at the clock input of FF 205. Clock signal 275 causes data signal 270 to be latched from data input D of FF 205 through to data output Q of FF 205. In a rising edge flip-flop embodiment of FF 205, data signal 270 is latched through to data output Q of FF 205 for each rising edge of clock signal 275.

In a process block 415, a time shift Ts1 is applied to data signal 270 relative to clock signal 275 at inputs 280 and 285. Time shift Ts1 is gradually increased for each cycle of clock signal 275 until data signal 270 fails to validly latch at FF 205. Output 245 is monitored to determine when the point of failure occurs. At this failure point, data signal 270 is no longer valid at data input D of FF 205 when the rising edge of clock signal 275 reaches the clock input of FF 205 and therefore invalid data is latched through to output Q of FF 205. In a process block 420, the amount of applied Ts1 at the instance of failure is measured.

In a process 425, data signal 270 and clock signal 275 are swapped. Clock signal 275 is now applied to input 280 and propagated through data buffer 255 to node N1 and data signal 270 is now applied to input 285 and propagated through clock buffer 260 to node N2. From node N1, clock signal 275 propagates through inverter 215 and an inversion of clock signal 275 is received at the clock input of FF 210. From node N2, data signal 270 propagates through inverter 220 and an inversion of data signal 280 is received at data input D of FF 210. In a process block 430, the inversion of data signal 280 is latched through from data input D of FF 210 to data output Q of FF 210 synchronized to the inversion of clock signal 275.

In a process block 435, a time shift Ts2 is applied to data signal 275, now applied to input 280, relative to clock signal 270, now applied to input 285. Time shift Ts2 is gradually increased for each cycle of clock signal 275 until the inversion of data signal 270 fails to validly latch at FF 210. Output 250 is monitored to determine when the point of failure occurs. At this failure point, the inversion of data signal 270 is no longer valid at data input D of FF 210 when the rising edge of inverted clock signal 275 reaches the clock input of FF 210. In a process block 440, an amount of time shift Ts2 at the instance of failure is measured.

In a process block 445, the skew Tskew between propagation paths 257 and 263 is calculated based on the measured time shifts Ts1 and Ts2 by solving the following two equations, $$Ts1-Ts0=Tskew+Tsetup \quad \text{(Equation 3)}$$

$$Ts2-Ts0=-Tskew+Tsetup \quad \text{(Equation 4)}$$

where Ts0 represents the expected amount of time shift that would be necessary to cause failure if zero skew is present between propagation paths 257 and 263, and Tsetup represents the setup time of FF 205 and 210. It is assumed that Tsetup is nearly the same for both FFs 205 and 210. Accordingly, there are two equations (Equation 3 and Equation 4) and two unknowns (Tskew and Tsetup), which can be mathematically solved to determine the value of both Tskew and Tsetup.

Referring back to FIGS. 3A-C, if data signal 270 and clock signal 275 are applied to inputs 280 and 285, respectively, with a relative phase difference as illustrated in FIG. 3A between data signal 310 and clock signal 315, then Ts0 would equal to an applied time shift 350. Ts0 represents the amount of applied time shift at the inputs 280 and 285 that would be necessary to make data signal 310 no longer valid at the rising edge of clock signal 315 when no skew is present. In the case of positive skew (FIG. 3B), Ts1 would equal an applied time shift 355. In the case of negative skew (FIG. 3C), Ts1 would equal an applied time shift 360. It should be appreciated that the applied time shift need not only be to the left as illustrated in FIGS. 3B and 3C, but the signals could also be time shifted to the right.

The measurement of Ts2 is similar to that described for Ts1, except inversions of clock signal 270 and data signal 275 are used. When measuring Ts2, Tsetup does not change; however, Tskew is subtracted from Tsetup as opposed to added to Tsetup as is the case when measuring Ts1. Placement of a negative sign in front of Tskew in Equation 4 results from the definition of skew as given in Equation 2.

Figure 5:
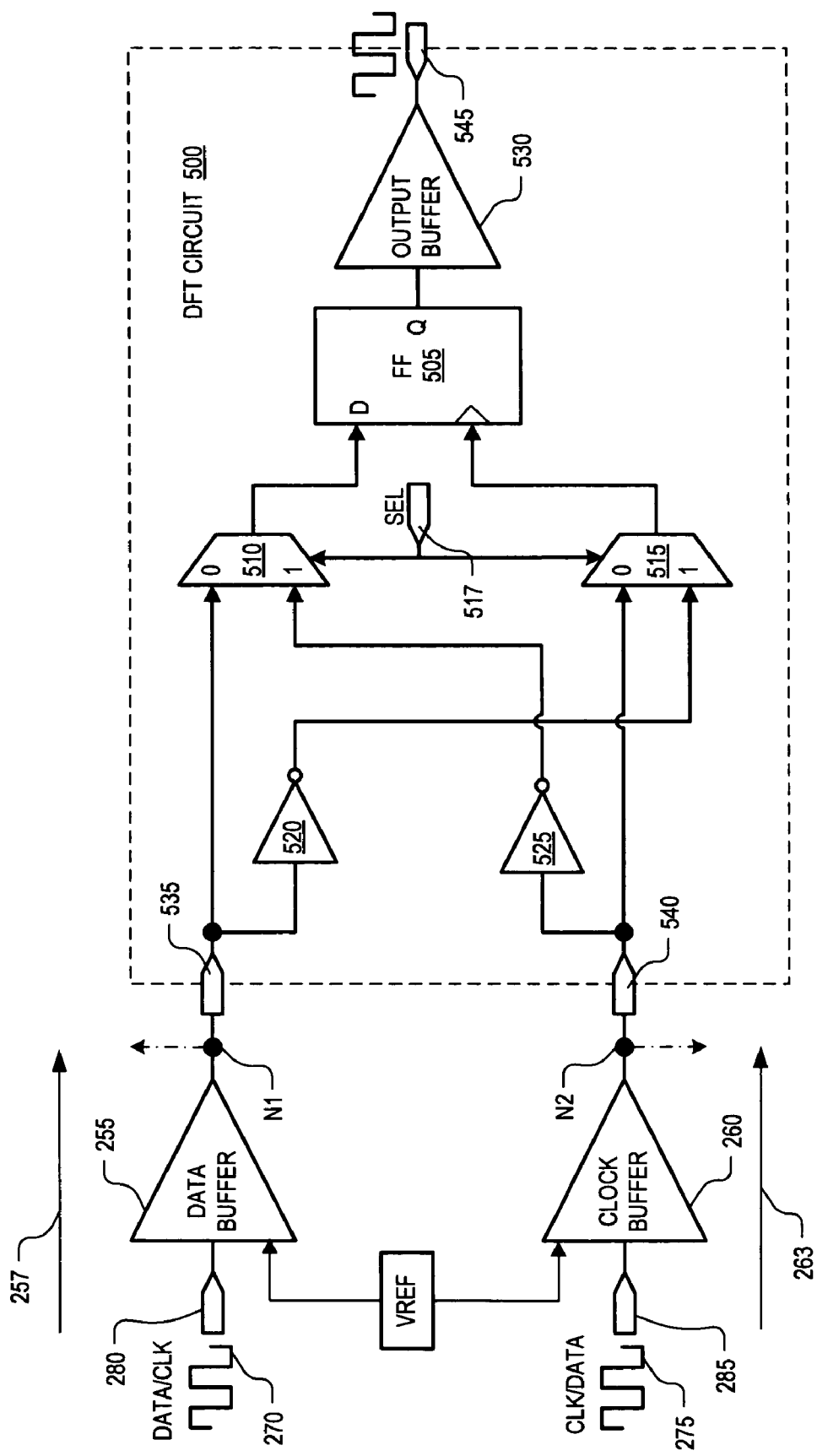
FIG. 5 is a schematic illustrating a DFT circuit for measuring skew between two points in a circuit, in accordance with an embodiment of the invention.

FIG. 5 is a schematic illustrating a DFT circuit 500 for measuring skew between any two nodes of an IC, in accordance with an embodiment of the invention. The illustrated embodiment of DFT circuit 500 includes a FF 505, multiplexers ("MUXs") 510 and 515, a MUX input selector ("SEL") 517, inverters 520 and 525, an output buffer 530, inputs 535 and 540, and an output 545. In one embodiment, FF 505 is a D flip-flop, though other types of flip-flops may be used, including rising edge and falling edge flip-flops, J-K flip-flops, T flip-flops, R-S latches, and other synchronous registering devices.

The components of DFT circuit 500 are interconnected as follows. Input 535 couples node N1 to input 0 of MUX 510. Input 540 couples node N2 to input 0 of MUX 515. Inverter 520 couples the inversion of node N1 to input 1 of MUX 515. Inverter 525 couples the inversion of node N2 to the input 1 of MUX 510. The output of MUX 510 is coupled to the data input D of FF 505 and the output of MUX 515 is coupled to the clock input of FF 505. The data output Q of FF 505 is coupled to output buffer 530, which in turn is coupled to output 545.

DFT circuit 500 operates in a similar manner to DFT circuit 200 and process 400 is equally applicable to DFT circuit 500. However, instead of monitoring the output of two different FFs to measure Ts1 and Ts2, only the data output Q of FF 505 needs to be monitored to measure both Ts1 and Ts2. When measuring Ts1, SEL is selectively set to SEL=0 and output 545 is monitored for the instance of failure when data signal 270 no longer validly latches from data input D of FF 505 to data output Q of FF 505. When measuring Ts2, SEL is selectively set to SEL=1 and output 545 is monitored for the instance of failure when the inversion of data signal 270 no longer validly latches from data input D of FF 505 to data output Q of FF 505. Since DFT circuit 500 uses only a single FF 505, Tsetup in Equations 3 and 4 are truly identical and not approximately equal, as is the case with DFT circuit 200. Accordingly, DFT circuit 500 may be capable of an even more accurate determination of Tskew than DFT circuit 200.

Figure 6:
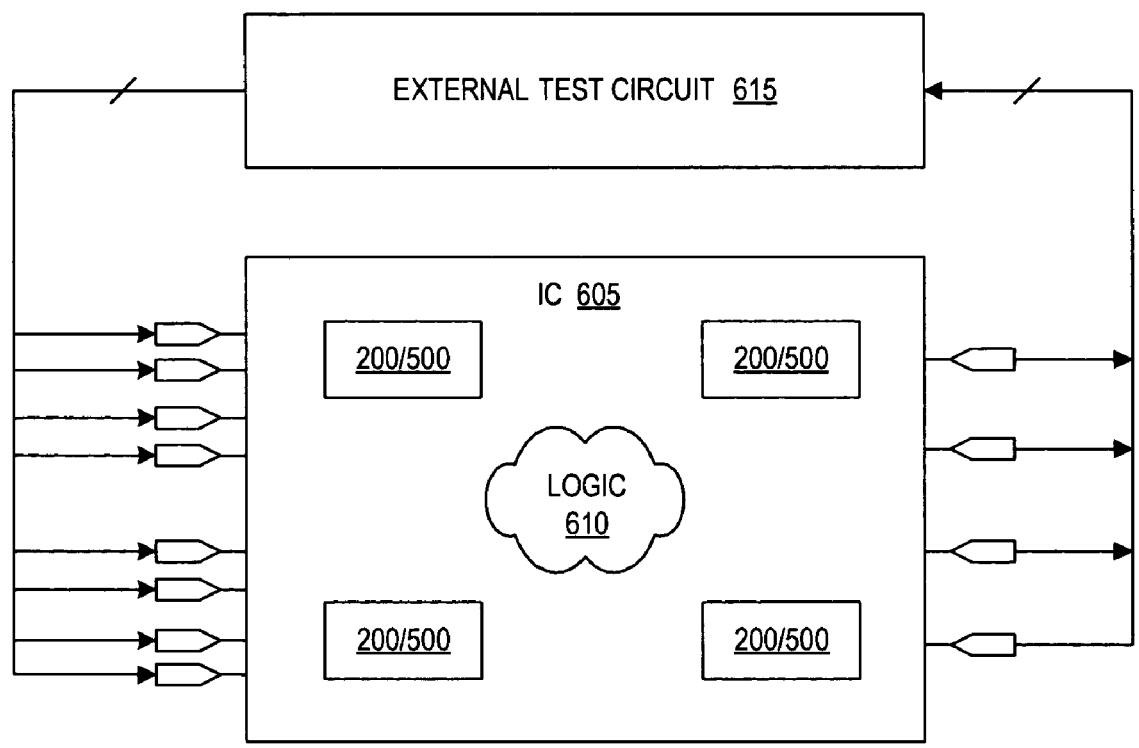
FIG. 6 is a block diagram illustrating a demonstrative integrated circuit including multiple DFT circuits for measuring skew at various points throughout the integrated circuit, in accordance with an embodiment of the invention.

FIG. 6 is a block diagram illustrating a demonstrative IC 605 including multiple DFT circuits 200 and/or 500 for measuring skew at various points throughout IC 605, in accordance with an embodiment of the invention. IC 605 may include logic elements 610 for performing general purpose or special purpose functions. Logic 610 may include a number of high-speed datapaths (e.g., Gigabit Ethernet) and high-speed clock paths for communicating internally within IC 605 or for communicating with devices and/or networks external to IC 605 (e.g., input/output communication links). For example, IC 605 may represent a router, a switch, a network processing unit ("NPU"), a network search engine, an application specific integrated circuit ("ASIC"), a general purpose processor, a graphic engine, a memory controller, or the like. DFT circuits 200 and 500 may be embedded within IC 605 to test and measure skew between any two propagation paths within IC 605, and are well suited for testing skew of high-speed propagation paths (e.g., 1 Gbps and greater datapaths).

To stimulate DFT circuits 200 and/or 500 as described in process 400, an external test circuit 615 may be externally coupled to IC 605. External test circuit 615 generates one or more data signals 270 and one or more clock signals 275 and monitors the outputs of DFT circuits 200 and 500 (i.e., outputs 245, 250, and 545) to determine when the flip-flops fail to validly latch the data signals. In addition, external test circuit 615 may further include logic to measure time shifts Ts1 and Ts2 at the points of failure and to calculate the skew (Tskew) therefrom. In one embodiment, external test circuit 615 may be capable of stimulating multiple DFT circuits 200 and 500 simultaneously or consecutively. In one embodiment, external test circuit 615 acts as a sort of "test bench circuit" for measuring the skew between various propagation paths throughout IC 605 using embedded DFT circuits 200 and/or 500.

Therefore, DFT circuits 200 and 500 may be incorporated into IC 605, as well as, almost any other type of circuit. Descriptions of DFT circuits 200 and 500 and IC 605 may be generated and compiled for incorporation into other integrated circuits, such as general purpose processors or various application specific integrated circuits ("ASICs"). For example, behavioral level code describing DFT circuits 200 and 500 and IC 605, or portions thereof, may be generated using a hardware descriptive language, such as VHDL (Very High-speed integrated circuit Hardware Descriptive Language) or Verilog, and stored to a machine-accessible medium (e.g., CD-ROM, hard disk, floppy disk, etc.). Furthermore, the behavioral level code can be compiled/synthesized into register transfer level ("RTL") code, a netlist, or even a circuit layout and stored to a machine-accessible medium. The behavioral level code, the RTL code, the netlist, and the circuit layout all represent various levels of abstraction to describe DFT circuits 200 and 500 and IC 605.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A test circuit for measuring skew, comprising:
    first and second inverters each including an inverter output, the first inverter coupled to invert a circuit output of a first circuit block, the second inverter coupled to invert a circuit output of a second circuit block; and
    first and second flip-flops ("FFs") each including a data input, a clock input, and a data output, the data input of the first FF coupled to the circuit output of the first circuit block, the clock input of the first FF coupled to the circuit output of the second circuit block, the data input of the second FF coupled to the inverter output of the second inverter, and the clock input of the second FF coupled to the inverter output of the first inverter, wherein the test circuit is coupled to measure skew between the circuit outputs of the first and second circuit blocks.

2. The test circuit of claim 1, further comprising:
    a first output buffer coupled to the data output of the first FF; and
    a second output buffer coupled to the data output of the second FF.

3. The test circuit of claim 2, wherein the first and second inverts, the first and second FFs, and the first and second output buffers comprise a design for test ("DFT") circuit embedded within an integrated circuit ("IC").

4. The test circuit of claim 3, wherein the first circuit block comprises a data buffer of a datapath within the IC and the second circuit block comprises a clock buffer of a clock path within the IC, and wherein the DFT circuit is coupled into the IC to measure skew between the clock buffer and the data buffer.

5. The test circuit of claim 1, wherein the first and second FFs comprise D flip-flops.

6. The test circuit of claim 1, wherein the test circuit is embedded within an integrated circuit described using a hardware descriptive language ("HDL") and stored to a machine readable medium.

7. A test circuit for measuring skew, comprising:
    a flip-flop including a data input, a clock input, and a data output;
    a first multiplexer ("MUX") selectively coupling a circuit output of a first circuit block and an inversion of a circuit output of a second circuit block to the data input of the flip-flop; and
    a second MUX selectively coupling an inversion of the circuit output of the first circuit block and the circuit output of the second circuit block to the clock input of the flip-flop, wherein the test circuit is coupled to measure skew between the circuit outputs of the first and second circuit blocks.

8. The test circuit of claim 7, wherein the circuit output of the first circuit block is coupled to a first MUX input of the first MUX and the circuit output of the second circuit block is coupled to a first MUX input of the second MUX, and further comprising:
    a first inverter including a first inverter input and a first inverter output, the first inverter input coupled to the circuit output of the first circuit block, the first inverter output coupled to a second MUX input of the second MUX to invert the circuit output of the first circuit block; and
    a second inverter including a second inverter input and a second inverter output, the second inverter input coupled to the circuit output of the second circuit block and the second inverter output coupled to a second MUX input of the first MUX to invert the circuit output of the first circuit block.

9. The test circuit of claim 8, further comprising an output buffer coupled to the data output of the FF.

10. The test circuit of claim 9, further comprising a select input coupled to control the first and second MUXs, the select input to select either the first MUX input of the first and second MUXs or the second MUX input of the first and second MUXs.

11. The test circuit of claim 10, wherein the test circuit comprises a design for test ("DFT") circuit embedded within an integrated circuit ("IC"), wherein the first circuit block comprises a data buffer of a datapath within the IC and the second circuit block comprises a clock buffer of a clock path within the IC, and wherein the DFT circuit is coupled into the IC to measure skew between the data buffer and the clock buffer.

12. The test circuit of claim 11, wherein the data buffer and the clock buffer comprises differential high-speed transceiver logic.

13. The test circuit of claim 7, wherein the test circuit is embedded within an integrated circuit described using a hardware descriptive language ("HDL") and stored to a machine readable medium.

14. A method to measure skew between first and second circuit blocks of an integrated circuit ("IC"), the method comprising:
    propagating a first data signal through the first circuit block and a first clock signal through the second circuit block;
    latching the first data signal synchronized to the first clock signal after propagating the first data and clock signals;
    time shifting the first data signal relative to the first clock signal until the first data signal is no longer validly latching;
    propagating a second data signal through the second circuit block and a second clock signal through the first circuit block;
    latching an inversion of the second data signal synchronized to an inversion of the second clock signal after propagating the second data and clock signals; and
    time shifting the second data signal relative to the second clock signal until the inversion of the second data signal is no longer validly latching.

15. The method of claim 14, further comprising:
measuring a first amount of the time shifting of the first data signal relative to the first clock signal when the first data signal begins to no longer validly latch;
measuring a second amount of the time shifting of the second data signal relative to the second clock signal when the inversion of the second data signal begins to no longer validly latch; and
calculating the skew between the first and second circuit blocks based on the first and second amounts of the time shifting.

16. The method of claim 15, wherein latching the first data signal and latching the second data signal comprise latching the first and second data signals with one or more flip-flops of a design for test ("DFT") circuit coupled to outputs of the first and second circuit blocks, and wherein calculating the skew between the first and second circuit blocks comprises solving the following equations:

$$Ts1 - Tideal = Tskew + Tsetup,$$

$$Ts2 - Tideal = -Tskew + Tsetup,$$

where Ts1 represents the first amount of the time shifting, Ts2 represents the second amount of the time shifting, Tideal represents a third amount of time shifting if no skew is present, Tskew represent the skew, and Tsetup represents a setup time of the one or more flip-flops.

17. The method of claim 16,
wherein the one or more flip-flops comprise first and second flip-flops each including a data input, a clock input, and a data output,
wherein latching the first data signal synchronized to the first clock signal comprises latching the first data signal from the data input to the data output of the first flip-flop and providing the first clock signal to the clock input of the first flip-flop, and
wherein latching the inversion of the second data signal synchronized to the inversion of the second clock signal comprises latching the inversion of the second data signal from the data input to the data output of the second flip-flop and providing the inversion of the second clock signal to the clock input of the second flip-flop.

18. The method of claim 16,
wherein the one or more flip-flops comprise a single flip-flop including a data input coupled to a first multiplexer ("MUX") and a clock input coupled to a second MUX, and a data output,
wherein latching the first data signal synchronized to the first clock signal comprises selecting the first and second MUXs to provide the first data signal to the data input and the first clock signal to the clock input to latch the first data signal from the data input to the data output, and
wherein latching the inversion of the second data signal synchronized to the inversion of the second clock signal comprises selecting the first and second MUXs to provide the inversion of the second data signal to the data input and the inversion of the second clock signal to the clock input to latch the inversion of the second data signal from the data input to the data output.

19. The method of claim 16, wherein the first circuit block comprises a data buffer within a datapath of the IC and the second circuit block comprises a clock buffer within a clock path of the IC.

20. The method of claim 19, further comprising:
generating the first and second data signals and the first and second clock signals with a test circuit coupled externally to the IC; and
monitoring an output of the DFT circuit embedded within the IC with the test circuit to determine when the first data signal and the inversion of the second data signal begin to no longer validly latch,
wherein calculating the skew comprises calculating the skew with the test circuit coupled externally to the IC.

\* \* \* \* \*